LARGE AREA WAFER SEMICONDUCTOR DEVICE

Filed May 12, 1966

INVENTORS
JOHN L. BOYER
RICHARD A. HARTMAN

BY ATTORNEYS
OSTROLENK, FABER, GERB & SOFFEN

United States Patent Office 3,382,419

Patented May 7, 1968

3,382,419

LARGE AREA WAFER SEMICONDUCTOR DEVICE

John L. Boyer, El Segundo, and Richard A. Hartman, Palos Verdes Estates, Calif., assignors to International Rectifier Corporation, El Segundo, Calif., a corporation of California

Filed May 12, 1966, Ser. No. 549,671
6 Claims. (Cl. 317—234)

ABSTRACT OF THE DISCLOSURE

The upper expansion plate of a large area semiconductor wafer is connected to a coaxial conductive tube, and the plate is segmented into a plurality of spaced sections, with the tubular conductor being similarly segmented. The upper segmented large area expansion plate is then connected to the large area wafer, with its segmented construction decreasing the effects on the wafer of differential expansion and contraction between the expansion plate and semiconductor wafer due to temperature change.

This invention relates to semiconductor device assemblies, and more specifically relates to a novel electrode plate construction for large area semiconductor wafers which minimizes stresses on the wafer due to differential expansion and contraction of the wafer and the plate connected thereto.

Semiconductor devices, such as rectifiers employing silicon wafers having a rectifying junction therein, are well known in the art. In order to make contact to the wafer, it is common practice to sandwich the wafer between metallic plates which have coefficients of thermal expansion which are close to the coefficient of thermal expansion of silicon.

Typical metals for this application are molybdenum and tungsten. This matching is satisfactory where the wafer diameter is relatively small so that the total radial expansion and contraction will be relatively small during operation of the device. However, where these wafer assemblies are to be soldered into place within a housing, the temperatures required for soldering can cause considerable differential expansion between the silicon and the expansion plate connected thereto, even though the coefficients of expansion are relatively closely matched. Accordingly, when the wafer diameter becomes relatively large and exceeds, for example, 1.0 inch in diameter, the differential expansion and contraction during operation of the device and during the assembling of the device becomes so high that there is great danger of damage or fracture of the brittle semiconductor wafer.

The principle of the present invention is to form at least the upper electrode of a typical sandwich of a semiconductor wafer with upper and lower electrodes of molybdenum or tungsten, or the like, of a segmented structure. That is to say, where molybdenum plates are used, the upper molybdenum disk will be made of a plurality of mechanical isolated segments which are each individually soldered to the upper surface of the wafer. A tubular conducting member which has one end thereof connected, for example, to a pigtail conductor is similarly segmented at its opposite end so that the end segments can be individually connected to respective upper plate segments so that the individual upper plate segments are free to have relatively small movement with respect to one another in order to absorb differential expansion motion.

Accordingly, a primary object of this invention is to provide a novel contact structure for high current semiconductor devices.

Another object of this invention is to decrease the possibility of fracture of a relatively fragile large area wafer of semiconductor material due to differential expansion and contraction of the plates connected thereto.

Yet another object of this invention is to provide a novel contact structure for a large area high current capacity semiconductor device.

These and other objects of this invention will become apparent from the following description when taken in connection with the drawings, in which.

Figure 1:
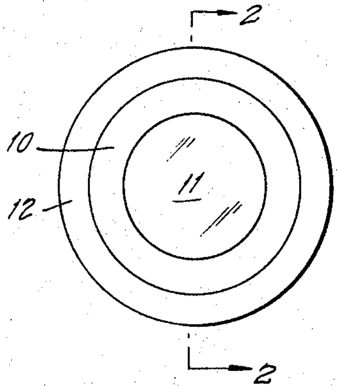
FIG. 1 (PRIOR ART)
FIGURE 1 is a top plan view of a typical prior art subassembly of a semiconductor wafer having upper and lower contact plates soldered thereto.
Figure 2:
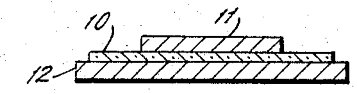
FIG. 2 (PRIOR ART)
FIGURE 2 is a cross-sectional view of FIGURE 1 taken across the lines 2—2 in FIGURE 1.

Referring first to FIGURES 1 and 2, there is illustrated therein a typical prior art subassembly for a wafer 10 of semiconductor material, such as silicon, which has molybdenum contacts 11 and 12 soldered to the opposite surfaces thereof. The upper and lower metallic contacts 11 and 12 are chosen to be of a material having thermal expansion characteristics as close as possible to the silicon wafer 10 to prevent damage to wafer 10 due to differential thermal expansion and contraction between plates 11 and 12 and wafer 10. To this end, molybdenum is commonly chosen for plates 11 and 12, although tungsten or other suitable alloys could also be used.

It has been found that when the subassembly of FIGURES 1 and 2 is soldered or brazed into its housing or alternatively when the area of wafer 10 is extremely large, there will be sufficient differential expansion and contraction of plate 11, for example, with respect to wafer 10, to cause damage to wafer 10. Note that wafer 10 will contain one or more junctions therein which are placed in the wafer by suitable diffusion or alloying techniques.

In accordance with the present invention, at least the top expansion plate is divided into a plurality of segments which mechanically divides the entire device into several smaller devices, although it is still a single electrical device.

Figure 3:
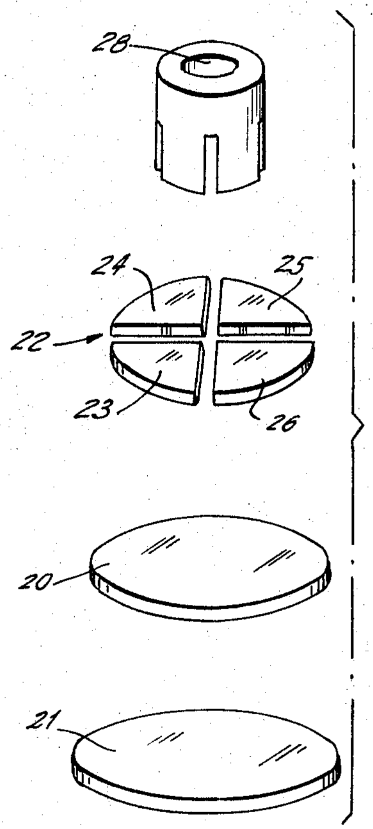
FIGURE 3 is an exploded perspective view of the subassembly constructed in accordance with the present invention.

FIGURE 3 illustrates the components of the novel subassembly in perspective view where a silicon wafer 20 is contained between a lower plate 21, which could be of molybdenum or its equivalent, while the upper plate 22 is formed of a plurality of mechanically separate segments 23 through 26. The upper plate 22 will similarly be of molybdenum or of a material equivalent thereto such as tungsten, or the like. An upper contact tube 27 which has an opening 28 at the top thereof for receiving a suitable pigtail conductor then has its bottom end segmented to form a plurality of segments shown in FIGURE 5 as segments 30, 31, 32 and 33 which are connected to plate segments 23, 24, 25 and 26, respectively.

While the assembly of tube 28 and segmented disk 22 can be formed in any desired manner, the preferred method of construction is to initially braze the lower end of tube 27 to a solid disk 22 prior to cutting the disk 22 into its segments. Thereafter, a saw cut is made directly through the disk 22 with the same saw cut passing through the lower end of tube 27 so that each of the segments 23 through 26 are intimately secured to their respective fingers defined at the bottom of tube 27 by the perpendicular saw cuts extending therethrough. That is to say, all four parts 23 through 26 of plate 22 are flexible with respect to one another, but are held together for subsequent soldering or other similar fusion to the upper surface of wafer 20.

Figure 4:
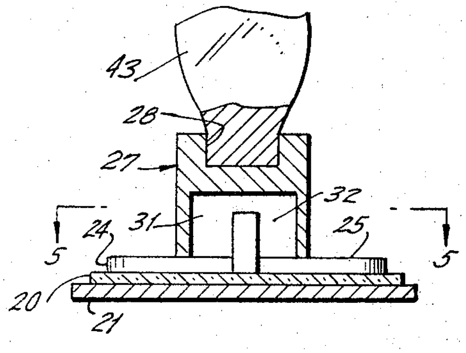
FIGURE 4 is a cross-sectional view of the novel subassembly of FIGURE 3 in its assembled condition.
Figure 5:
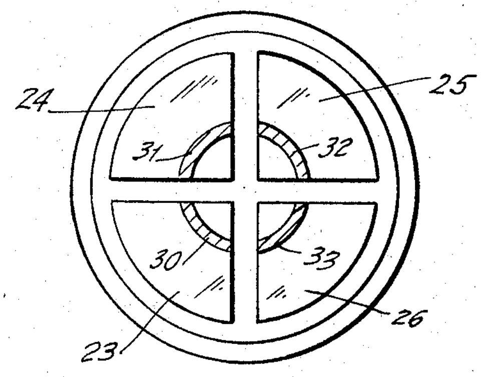
FIGURE 5 is a cross-sectional view of FIGURE 4 taken across the lines 5—5 in FIGURE 4.

The subassembly is best shown in FIGURES 4 and 5 where it is seen that wafer 20 is soldered or brazed to the lower disk 21 in the usual manner. Thereafter, the segments 23 through 26 are suitably soldered to the upper surface of wafer 20 with a suitable soft solder which flows between the segments of the top plate. The soft solder bridges between the segments permits relative motion of the segments with respect to one another due to differential expansion and contraction, but permits electrical continuity over the full surrace of the wafer. It has been found that with this type of arrangement, at least a 50% greater diameter for a wafer can be made without serious thermal stress that would crack the silicon or cause reduction in its voltage characteristics. For example, wafer diameters greater than about 1 inch, which could not be easily used heretofore with continuous upper and lower expansion plates can now be fabricated with the present invention.

Figure 6:
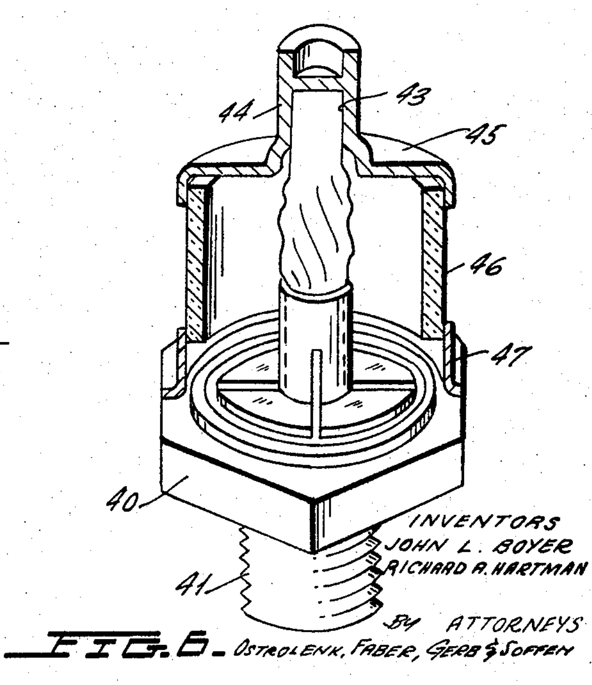
FIGURE 6 is a partial cut-away perspective view of the novel subassembly of FIGURE 5 when assembled in a typical rectifier housing.

FIGURE 6 illustrates a typical manner in which the subassembly of the invention can be mounted into a rectifier housing.

Referring now to FIGURE 6, a typical conductive plate 40 having a threaded stud 41 extended therefrom has the bottom surface of lower plate 21 soldered or brazed thereto in the usual manner. A pigtail 43, which is suitably connected in openings 28 of conductive tube 27, is then received in the opening 43 of the conductive tube 44 which is suitably secured to conductive plate 45. Plate 45 is then connected to the ceramic cylinder 46, the bottom of which is connected to a conductive welding ring 47 which is welded to the top of conductive base 40 and surrounds the wafer subassembly and hermetically seals the assembly for the external atmosphere. Clearly, any type of housing could be used in order to house the novel wafer subassembly.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. An electrode for a semiconductor wafer; said electrode comprising a flat segmented disk of material having a coefficient of thermal expansion close to the coefficient of thermal expansion of silicon; a hollow conductive tube; one end of said hollow conductive tube having a plurality of axially directed slots therein to define a plurality of separate fingers; each of said separate fingers of said hollow conductive tube electrically and mechanically connected to a respective segment of said segmented disk, whereby each of said segments are free to have relative motion in the plane of said disk with respect to the other of said segments defining said disk.

2. The electrode of claim 1 wherein said segments define a substantially continuous disk having a central axis; said conductive tube coaxial with said central axis.

3. A semiconductor device comprising a continuous wafer of semiconductor material, and flat upper and lower expansion plates connected to the upper and lower surfaces, respectively, of said wafer; said upper and lower surfaces of said wafer having respective constant conductivity types separated by at least one P-N junction extending across said wafer; said flat upper and lower expansion plates of materials having coefficients of thermal expansion similar to the coefficient of thermal expansion of said wafer of semiconductor material; said upper expansion plate divided into a plurality of planar spaced segments; and first common contact means connected to said plurality of spaced segments, and second contact means connected to said lower expansion plate; said first common contact means permitting lateral movement of said planar spaced segments with respect to one another.

4. The device as set forth in claim 3 wherein said first common contact means comprises a conductive cylinder; one end of said conductive cylinder having a plurality of axially directed slots therein to define a plurality of separate fingers; each of said plurality of separate fingers electrically and mechanically connected to a respective segment of said plurality of spaced segments.

5. The device as set forth in claim 4 wherein said conductive cylinder is a hollow tube.

6. The device as set forth in claim 4 wherein said conductive cylinder is coaxial with the axis of said upper plate.

References Cited

UNITED STATES PATENTS

| | | | |
|---|---|---|---|
| 3,068,383 | 12/1962 | Herlet et al. | 317—234 |
| 3,105,926 | 10/1963 | Herlet | 317—234 |
| 3,252,060 | 6/1966 | Marino et al. | 317—234 |
| 3,273,029 | 9/1966 | Ross | 317—234 |
| 3,296,501 | 1/1967 | Moore | 317—234 |

JOHN W. HUCKERT, *Primary Examiner.*

J. R. SHEWMAKER, *Assistant Examiner.*